United States Patent [19]

Galvagni et al.

[11] Patent Number: 4,791,006

[45] Date of Patent: Dec. 13, 1988

[54] HIGH ACCURACY VARIABLE THICKNESS LAYDOWN METHOD FOR ELECTRONIC COMPONENTS

[75] Inventors: John L. Galvagni, Colorado Springs; Philip A. Troup, Manitou Springs, both of Colo.

[73] Assignee: AVX Corporation, Great Neck, N.Y.

[21] Appl. No.: 58,194

[22] Filed: Jun. 4, 1987

[51] Int. Cl.[4] .................. B05D 5/12; B05D 1/32
[52] U.S. Cl. .................. 427/282; 101/127; 101/129
[58] Field of Search .................. 427/282; 101/128.21, 101/129, 127; 118/504, 505

[56] References Cited

U.S. PATENT DOCUMENTS

| | | | |
|---|---|---|---|
| 4,082,906 | 4/1978 | Amin et al. | 428/539 |
| 4,274,124 | 6/1981 | Feinberg et al. | 361/275 |
| 4,435,738 | 3/1984 | Barber, Jr. et al. | 361/321 |
| 4,455,590 | 6/1984 | Alexander | 361/306 |
| 4,516,187 | 5/1985 | Lavene | 361/309 |

OTHER PUBLICATIONS

Brady, J. J. et al., "Screening Mask for Depositing Large Area Paste Deposits", IBM Technical Disclosure Bulletin, vol. 20, No. 9, Feb. 1978, pp. 3429-3430.

Primary Examiner—Evan Lawrence
Attorney, Agent, or Firm—Arthur B. Colvin

[57] ABSTRACT

A method for forming conductive paths of varying thickness on miniature electronic components such as I.C. and capacitors is disclosed. In accordance with the method there is provided a planar mask, the undersurface of which includes recessed areas of varying thickness and may include throughgoing paths. Apertures are formed through the mask in registry with the recessed areas and conductive path forming material is forced through the apertures and throughgoing paths to fill the recessed areas and paths. The mask is removed to form increments of conductive material of differing thickness corresponding to the thickness of the recessed areas and paths.

5 Claims, 2 Drawing Sheets

HIGH ACCURACY VARIABLE THICKNESS LAYDOWN METHOD FOR ELECTRONIC COMPONENTS

BACKGROUND OF THE INVENTION

1. Field of the Invention

The present invention is in the field of formation of electronic components and more particularly relates to a novel method of forming on miniaturized electronic components conductive paths and land areas of varying thickness.

2. Prior Art

In the manufacture of electronic components such as I.C. devices, capacitors, and the like, and particularly miniaturized devices of the type described, it is highly desirable to utilize the surface area of the substrate in a most efficient manner so as to enable a maximum amount of circuitry to be concentrated in a minimal area. Devices of the type described necessarily incorporate a multiplicity of conductive paths leading between individual elements of the circuitry and also leading to termination areas for connection to ancillary components. Certain of the internal conductors may carry very limited amounts of current and thus, may be of very small cross section area. Others of the internal conductors on the same substrate may carry significant amounts of current and must be of substantially greater cross sectional area. In addition, where connections between conductor paths and terminals leading to the exterior of the device are to be effected, it is highly desirable that the interface between the terminals and conductive paths be of greater conductivity than the conductive path itself.

Conductive paths are typically formed of expensive materials such as silver and gold and it is accordingly highly desirable that the paths be tailored to the conductance capacities required so that the quantum of conductive material employed is neither too large nor too small.

In the manufacture of miniaturized electronic devices, conductive paths of varying current carrying capacities were fabricated in accordance with one or the other of two accepted methods. In accordance with a first method, the conductive material was screened onto the surface of the substrate through a mask which incorporated narrow pathways where the current carrying capacity of the conductor was not great and wider pathways where larger currents were to be encountered, such as at the power supply terminals to an I.C. device. In all instances in accordance with the described method, the thickness of the conductive path is regulated by the thickness of the mask and thus, greater conductivity could be achieved only by forming a wider path with the result that substantial surface areas of the substrate were covered where high conductivity paths were requried.

In order to more economically employ the surface area of the substrate, it has been suggested to form the conductive paths of varying thickness rather than of varying width. The methods heretofore employed for forming variable thickness paths have embodied drawbacks which have precluded their successful practice.

In accordance with a first method, one or more series of conductive paths is formed on the substrate using a mask of a first thickness resulting in the formation of conductive paths corresponding to the thickness of the mask. Thereafter, where it is desired to form conductive paths or areas of greater thickness the first mask is removed and a second mask of greater thickness substituted whereupon deposits of conductor forming material corresponding to the greater thickness of the second mask could be effected on the substrate. As will be readily recognized when it is considered that certain of the substrate areas may be only fifty thousands of an inch in each direction, the coordination of positioning of a first mask and a second mask present almost insuperable difficulties, particularly when it is considered that miniaturized parts must typically be formed hundreds or thousands at a time.

An attempt has been made to fabricate parts of varying thicknesses with a single masking step. Such a process is suggested by the Presco Screen Division of the AMI Corporation of North Branch, New Jersey. Briefly stated, the Presco process comprises providing a screen having a flat surface placed against the substrate to receive the conductive components. The upper surface of the screen is etched away in certain areas where it is intended that thin films are to be deposited. Through going apertures are formed through the screen both in the etched away areas and in the full thickness areas of the screen. In use, electroding inks or pastes are forced through the various apertures in the screen, namely the apertures in the etched away reduced thickness areas and in the full thickness areas. A soft, highly compliant squeegee is passed over the surface of the screen, the squeegee entering into the reduced thickness etched away areas so as to reduce the column or thickness of material extending through the apertures in the reduced thickness area to a level corresponding essentially to the height of the etched away area. The squeegee also removes excess material so that the apertures in the full thickness area are substantially filled. Following application of the squeegeeing step, the mask is removed from the substrate leaving increments of a first thickness in registry with the apertures formally in the full height area of the mask, and leaving thinner increments of the electrode material at those areas in registry with the etched away portions of the mask.

As will be apparent from the description of the Presco screen, the Presco process is of limited utility particularly where miniaturized components are to be processed. Firstly, since the formation of half height electroding increments in the etched area is dependent upon the squeegee being able to extend into the etched area while adjacent portions of the squeegee are supported on the full height area, it is obvious that the Presco device can be used only in connection with large and well separated patterns, since thinning of the electroded material is dependent upon the material of the squeegee extruding into the etched away upper surface of the Presco screen. As a practical matter, the Presco procedure can only be used in respect of features on the order of one hundred mils or more, thus rendering the Presco screening device unsuitable for processing miniaturized electronic devices. Finally, a further shortcoming of the Presco system resides in the fact that due to the extreme softness required of the squeegee for penetration into the etched areas, the squeegee will likewise partially project into the apertures in the full thickness portions of the Presco screen and necessarily displace increments of material from the full height paths. That is to say, since the pressure which must necessarily be applied to the Presco squeegee must be sufficient to project increments of the squeegee into the etched away areas, the pressure will also be sufficient to project portions of the squeegee into the full height apertures displacing portions of the conductive filler material therein.

SUMMARY OF THE INVENTION

The present invention may be summarized as directed to a novel method of applying in a single screening operation increments of conductive material at accurately spaced positions and in precise thicknesses over a substrate to be coated, such as the dielectric layer of a capacitor which is to be formed with an electrode, a conductive or resistive path formed on a silicon chip, adjacent conductive paths and terminal lands of an I.C. device and the like. The method of the present invention is particularly advantageous in the formation of features as small as about two or three mils. While it is contemplated that the primary utility of the method lies in the formation of conductive paths of various heights and or conductive paths and terminal lands of greater height than the paths, it will be readily recognized that alternative uses of the method include the deposition of thicker and thinner coating areas, such as the glass coating areas applied over resistors, thicker areas being applied over those portions of the resistor which will remain constant, with thinner areas of glass deposited over increments of the resistor which may need subsequent laser trimming.

Still more particularly, the invention may be summarized as directed to a method which comprises providing a mask having a substantially planar upper surface, the mask of being of finite thickness and including etched away paths or areas on the undersurface of the mask. The mask includes through going apertures in registry with the etched away pathways on the undersurface of the mask, and optionally may include apertures extending through the full thickness areas of the mask. In use, the undersurface of the mask is placed against a substrate to be coated and conductive paste material or inks are forced through the mask into contact with the substrate. The extrusion of the electrode or electrical path forming materials through the mask may be effected by a doctor blade or a hard squeegee, since unlike the Presco procedure which mandates the squeegee extending into apertures of the screen, it is desirable in the present process that the doctor blade or squeegee function merely as a levelor. After the electroding material has been forced through the screen, the screen is lifted away leaving areas of a first thickness corresponding with the full thickness of the mask in those portions previously occupied by apertures extending the entire height of the mask. In those areas previously in registry with the portions of the mask in which the undersurface has been etched away, the height of deposited material passing through the holes in registry with the etched away area corresponds substantially to the depth of the etching. In other words, the holes in the etched away area act merely as a conduit permitting flow of the viscous material which thereafter occupies the entirety of the etched away area up to the height of the downwardly directed surface of the etched area.

It is accordingly an object on the present invention to provide an improved screening method for simultaneously forming in a single screening operation different thicknesses of screened material on a supported substrate. A further object of the invention is the provision of a method of the type described wherein it is possible to form two or more different thickness areas in a single screening step. A still further object of the invention is the provision of a method of the type described wherein features as small as two or three mils may be effectively formed. Still a further object of the invention is the provision of a method which permits patterns of a varying thickness to be simultaneously screened on a substrate whereby it is possible to form areas of different resistance in accordance with the deposited thickness.

In order to attain these objects and such other and further objects as may appear herein or be hereinafter pointed out, reference is made to the accompanying drawings in which.

DETAILED DESCRIPTION OF THE DRAWINGS

In accordance with the invention, there is illustrated in diagrammatic fashion in the views a method of forming in a single screening operation patterns of applied materials of varying depths. As will be evident to those skilled in the art, the size of the mask and applied materials have been grossly enlarged and simplified for purposes of illustration.

Figure 1:
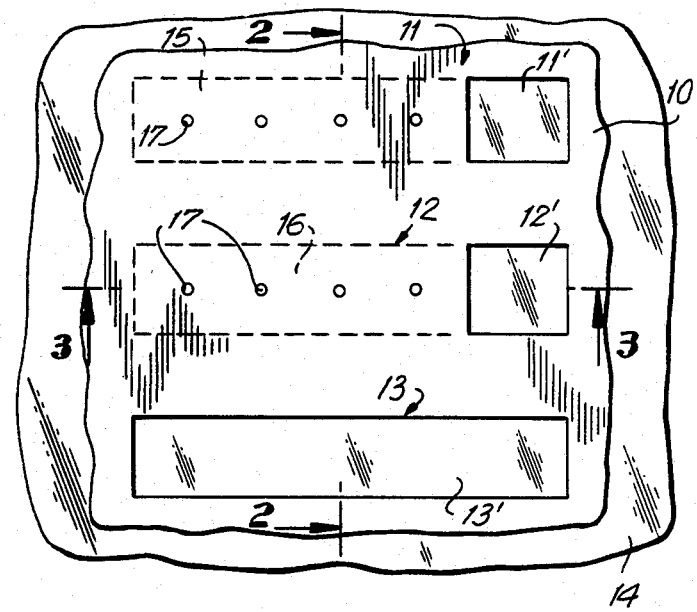
FIG. 1 is a fragmentary top plan view of a portion of a screen in accordance with the invention.

Referring now to FIG. 1, there is disclosed an increment 10 of a mask, the increment including by way of example three separate patterns 11, 12, and 13. While only a single pattern forming increment has been disclosed, it will be appreciated that the pattern typically is replicated hundreds or even thousands of times at the undersurface of an enlarged mask member which is in turn superposed over a comparably sized substrate 14. In practice, the total thickness T of the mask may be in the order of as small as one mil or less.

Figure 2:
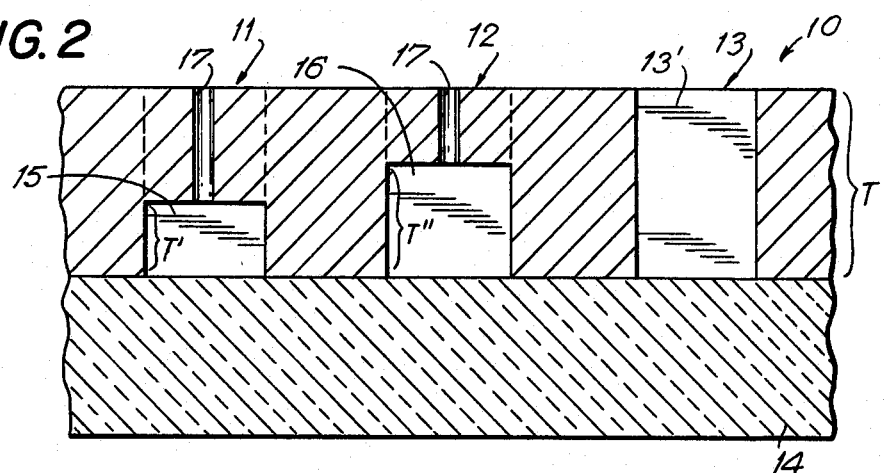
FIG. 2 is a magnified section taken on the line 2—2 of FIG. 1.
Figure 3:
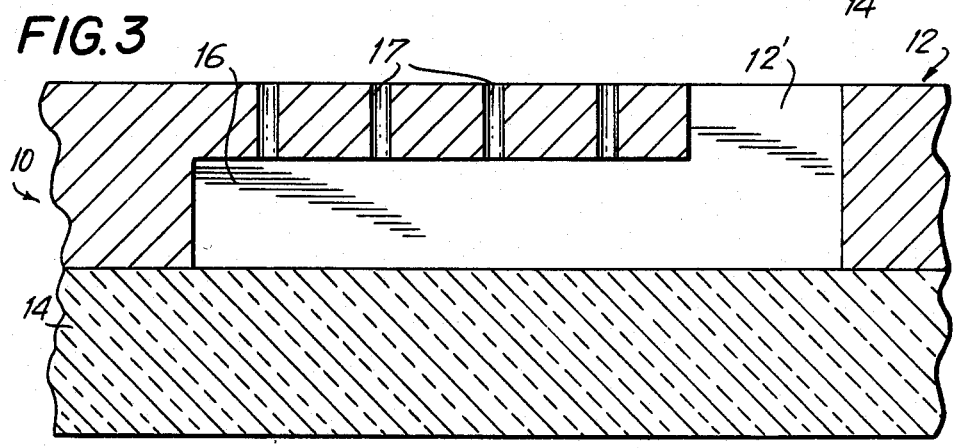
FIG. 3 is a magnified section taken on the line 3—3 of FIG. 1.

As best seen from FIGS. 1, 2 and 3, the paths or patterns 11, 12, and 13 forming a single repeat or increment 10 are comprised of through going aperture portions, e.g., 11', 12', and 13'. In the case of pattern 13, the full height portion is coextensive with the entire pattern 13. In addition, patterns 11 and 12 are etched or engraved on their undersurfaces defining in pattern 11 a recess area 15 of a thickness T'. In similar fashion, pattern 12 includes on the undersurface of the mask a recess area 16 of thickness T''. The recess area 15 is in communication with the throughgoing portion 11' of pattern 11, and in similar fashion recess area 16 of pattern 12 is in communication with the throughgoing portion 12' of pattern 12.

A plurality of throughgoing apertures 17 are formed through the mask 10 in registry with the recess areas 15 and 16.

Figure 2A:
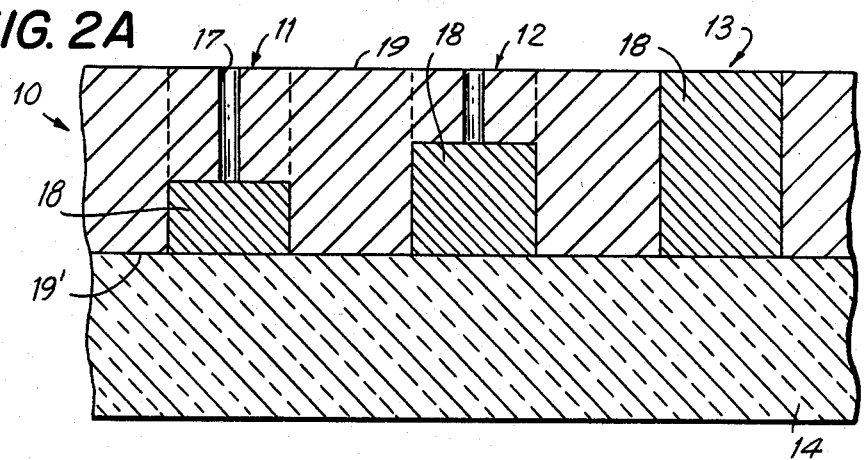
FIG. 2A is a view similar to FIG. 2 after application of electroding material.
Figure 3A:
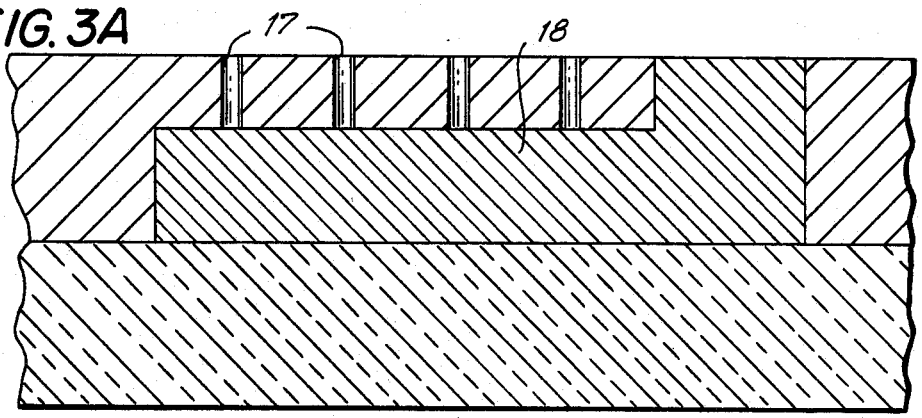
FIG. 3A is a view similar to FIG. 3 after application of electroding material.

In FIGS. 2A and 3A, the patterns 11, 12, and 13 are illustrated as having been filled with electroding material 18. The electroding material is introduced into the various cavities by applying an excess to the surface 19 of the mask (the uppersurface) while the undersurface 19' of the mask is tightly pressed against substrate 14, the excess material being thereafter extruded downwardly to fill the cavities defining patterns 11, 12, and 13 as by passing a doctor blade or hard rubber or metal squeegee repeatedly over the excess of electroding material previously deposited on uppersurface 19.

Figure 4:
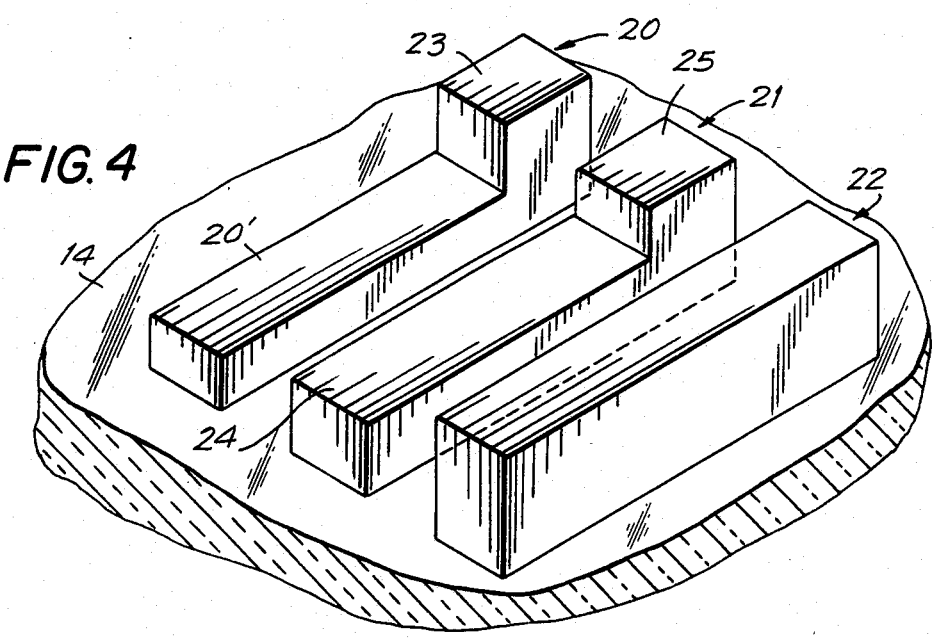
FIG. 4 is a perspective view of a substrate illustrating the pattern of applied material left after removal of the mask of FIG. 1.

As diagramatically illustrated in FIG. 4 upon removal of the mask 10, there will be deposited on substrate 14 three increments 20, 21, and 22 corresponding to patterns 11, 12, and 13 respectively. The member 20 includes a thin path portion 20' corresponding in thickness to the thickness T' of the path or recess in the undersurface of the mask. The increment 20 includes a full height portion 23 corresponding with the full thickness apertures 11' formed in the mask. In similar fashion increment 21 includes a partial height portion 24 corresponding in thickness to the portion T" of pattern 12 and a full height portion 25. Increment 22 is of constant height T corresponding to the height of the mask.

The electroding material used in preferably of high viscosity. An ink which has the appropriate rheological properties is sold by the Dupont Corporation under the trademark "Sprint" vehicle systems, such inks having a typical viscosity in the order of from about 100 to 300 Kcps. The precise viscosity is not critical to the successful operation of the process. However, it should be noted that desirably the viscosity is sufficiently high such that the material does not flow after removal of the mask.

As will be apparent from the preceding disclosure, the method of the present invention is suitable for the manufacture of a multiplicity of electronic components or the like. By way of example and without limitation, a typical use would be in the formation of ceramic capacitors. In this utilization, it is possible to imprint on a dielectric layer a thin pattern defining the electrode area of the capacitor and a thick pattern at the edge of the electrode which will define the termination. By this means, it is possible to assure good electrical contact between the termination material and the thickened edged portions of the electrodes. An alternate typical utilization of the method would be in conjunction with the formation of an I.C. device wherein thickened pathways are required in respect of the power supply terminals and thinner pathways would be satisfactory in respect of others of the terminals.

In addition, while it is considered that the principal advantage of the instant invention is directed to a method of forming conductors of various thickness and hence various current carrying capacities. The method is equally adapted to application of resistance forming compounds of various thickness wherein the ohmic resistance is a function of the thickness of the conductive path. Numerous other uses for the method will immediate suggest themselves to skilled workers in the art familiarized with the instant disclosure. Accordingly, the invention is to be broadly construed within the scope of the appended claims.

What is claimed as new and sought to be protected by Letters Patent of the United States is:

1. The method of forming on a substrate conductive paths of varying thickness comprising the steps of providing a planar mask having flat upper and lower surfaces, said lower surface of said mask including a path having at least one recessed portion extending toward but terminating short of said upper surface, at least one throughgoing aperture formed in said mask in registry with said recessed portion of said path, said mask including at least one additional path extending through the entire thickness of said mask placing said undersurface of said mask against said substrate, thereafter forcing a viscous conductor forming mass downwardly from said upper surface to said lower surface through said aperture and path to substantially fill said paths, thereafter removing said mask to form increments of said mass corresponding to the thickness of said paths and causing said increments of said mass remaining on said substrate to be converted to conductive material.

2. The method of claim 1 wherein said mass comprises a viscous paste including metal components dispersed in a binder.

3. The method of claim 2 wherein said mass is forced through said aperture and path by applying an excess of said mass on said upper surface and thereafter applying a downward wiping pressure against said mass on said upper surface.

4. The method of claim 3 wherein said downward wiping pressure is applied by passing said mask and substrate beneath a doctor blade.

5. The method of depositing on a substrate a conductive area comprising the steps of providing a planar mask of finite thickness, said mask including planar upper and lower surfaces, a continuous recessed path portion opening to said lower surface and extending partway toward said upper surface, said mask including aperture means extending from said upper surface and communicating with said path portion, placing said lower surface into engagement with a said substrate, thereafter forcing a viscous conductive forming mass through said aperture means to substantially fill said path portion and form on said substrate an increment of said mass corresponding to the thickness of said path portion and thereafter removing said mask and causing the increment of said mass remaining on said substrate to be converted into conductive material.

* * * * *